United States Patent [19]

Takeuchi et al.

[11] Patent Number: 4,804,919
[45] Date of Patent: Feb. 14, 1989

[54] NUCLEAR MAGNETIC RESONANCE IMAGING METHOD AND APPARATUS FOR REALIZING SAME

[75] Inventors: Hiroyuki Takeuchi; Hidenori Kishino, both of Kashiwa, Japan

[73] Assignee: Hitachi Medical Corp., Tokyo, Japan

[21] Appl. No.: 113,602

[22] Filed: Oct. 28, 1987

[30] Foreign Application Priority Data

Oct. 29, 1986 [JP] Japan .................................. 61-255667

[51] Int. Cl.$^4$ ............................................. G01R 33/20
[52] U.S. Cl. ...................................... 324/309; 324/307
[58] Field of Search ............... 324/300, 307, 309, 318, 324/322; 128/653

[56] References Cited

U.S. PATENT DOCUMENTS 4,616,182 10/1986 Kramer et al. ...................... 324/309
4,707,659 11/1987 Kunz et al. ........................... 324/309

OTHER PUBLICATIONS

Kumar et al, "NMR Fourier Zeugmatography", Jour Mag Res, 18, pp. 69-83, 1975.
Letters to the Editor, Physics in Medicine and Biology, vol. 25, No. 4, Jul. 1980, pp. 751-756.

Primary Examiner—Michael J. Tokar
Attorney, Agent, or Firm—Antonelli, Terry & Wands

[57] ABSTRACT

Before beginning a prior art imaging sequence, at first parts producing artifact are excited by applying a high frequency magnetic field thereto in a frequency band, which includes the parts emitting artifact and doesn't include a desired slice plane. Next, the phase of the excited spin is extremely rotated by applying at least one of gradient magnetic fields $G_x$, $G_y$, $G_z$. When the prior art imaging sequence is effected thereafter, the produced artifact is imaged as a high spatial frequency component of an object body to be examined. Since a usual object body to be examined contains many low spatial frequency components and the power of high spatial frequency components is extremely small, it becomes possible to reduce the artifact in such an extent that it cannot be practically recognized.

5 Claims, 5 Drawing Sheets

CONTOUR LINE OF B = CONST

GAUSS' FUNCTION

FM PULSE

NUCLEAR MAGNETIC RESONANCE IMAGING METHOD AND APPARATUS FOR REALIZING SAME

BACKGROUND OF THE INVENTION

This invention relates to an NMR imaging method using nuclear magnetic resonance (hereinbelow abbreviated to NMR) and an apparatus for realizing same, and in particular to an NMR imaging method and an apparatus for realizing same permitting to remove artifact originating from an object body to be examined outside of a uniform magnetic field.

In an NMR imaging method and an apparatus therefor it is necessary to separate and recognize signals coming from an object body to be examined, making them correspond to the position of each part in the object body to be examined. As a method therefor there is known a method, by which different magnetic fields are applied to different parts of the object body to be examined and positional information is obtained by making the resonance frequency or the phase shift quantity at different parts of the object body to be examined different in this way. FIG. 2 shows schemes for explaining the principle of the method described above and represents variations in high frequency magnetic field, gradient magnetic field and detection signal with respect to time. That is, a high frequency magnetic field and a gradient magnetic field, which are applied to the object body to be examined and an NMR signal originating from the object body to be examined are illustrated there. This method is named Fourier zeugmatography method by Kumar et al. and its fundamental principle is described in Journal of Magnetic Resonance (18, 69-83 (1975)). The spin warp method, which is a modification thereof, has been also proposed (Phys. Med. Biol. 25,751 (1980)) and starting therefrom, various changes and improvements have been made thereon.

For the imaging of a spatially large portion such as a human body it is necessary to generate a static magnetic field as strong as 0.05–2 Tesla with a uniformity less than several tens of ppm in a spherical space, whose diameter is as large as 30–50 cm. For this reason, in many NMR imaging apparatuses the cost of the static magnetic field generating section covers the greater part of the total cost. There are known various methods for generating a uniform and large magnetic field, but basically more larger the uniform space is, the higher the cost is. Therefore it is conceivable to restrict the uniform space to a practical extent in order to reduce the cost. However, this method has a serious problem that intense artifact from the object body outside of the uniform magnetic field is produced. FIGS. 3–5B are schemes for explaining this problem in connection with the imaging method. For the convenience' sake a two-dimensional spin warp method is taken as an example, but it will be easily inferred from the following explanation that similar problems are produced by other methods. FIG. 3 shows the distribution of a static magnetic field. In order to facilitate the understanding, it is supposed that the magnetic field is uniform within a sphere having a radius r and decreases or increases rapidly outside thereof. The object body to be examined is located in this static magnetic field and at first a slice plane is selected by applying a high frequency magnetic field having a restricted band and a gradient magnetic field $G_x$ at the same time. FIGS. 4A and 4B show circumstances at this time. FIG. 4A indicates that because of the fall of the static magnetic field selective excitation takes place not only at the slice plane $x = x_s \pm \Delta x$, which is to be aimed, but also at the neighborhood of $x = x_a$. FIG. 4B indicates the part (hatched part in the figure), where the selective excitation really takes place, in the X-Y plane at $Z = 0$. Here the linear part, which is parallel to the y axis in FIG. 4B, indicates the position of the slice plane, which is the object to be examined, and it is necessary to pay attention to the fact that the selective excitation takes place also at the curved part, which is not intended, at the same time. These circumstances are produced not only on the part at $Z = 0$ but also on a three-dimensional curved surface including the Z direction, depending on variations in the static magnetic field. Subsequently a gradient magnetic field $G_z$ is applied and the phase encode is effected in the Z direction. Finally signals are observed while applying a gradient magnetic field $G_y$ thereto. At this time the frequency of the signal varies, depending on the intensity of the magnetic field, which is proportional to the position on the Y axis, and positional information in the Y direction is expressed in the form of differences between frequencies. However, because of the fall of the static magnetic field just as for the selection of the slice plane, as indicated in FIG. 5A, there is a part at another position on the Y axis, where a signal having the same frequency is produced. FIG. 5B shows circumstances on the X-Y plane at $Z = 0$, and in connection with the selective excitation plane indicated in FIG. 4B, the curved surface portion right above in the hatched part in FIG. 5B emits non-intended signals. There circumstances take place on a three-dimensional curved surface, depending on variations in the static magnetic field, just as for the selection of the slice plane. If the object body exists also in this part, the image of the curved surface part is superposed on the properly so called reconstructed image of the slice plane and gives rise to strong artifact. Although it is supposed that the magnetic flux density decreases outside of the uniform magnetic field, in order to facilitate the understanding, and further that the gradient magnetic fields are ideally linear systems, it is easily inferred that also in the case where these two magnetic fields have other non-linear components, only the form of the curved surface varies and similar problems take place.

In a prior art device for imaging the human body, in order to avoid this problem, a uniform space, whose diameter is longer than 40 cm, is necessary, and even if such a uniform space is obtained, since the stature of the human body is longer than this size, artifact due to this fact may occur in parts above and/or below, or on the left and/or right sides of the image. Furthermore the cost reduction owing to the method, by which the uniform space is reduced, was practically impossible by the prior art method.

SUMMARY OF THE INVENTION

This invention has been done, taking the situations described above into account, and the object thereof is to provide an NMR imaging method and an apparatus for realizing same permitting to reduce remarkably artifact coming from the object body to be examined outside of the uniform magnetic field, even by using a low cost static magnetic field generating device, by which the necessary minimum uniform magnetic field is secured.

In an NMR imaging, in order to obtain positional information of the object body to be examined, a method is used, by which the frequencies are made different by using gradient magnetic fields. At this time the problem consists in the fact that there exist parts, apart from the desired part, emitting signals having the same frequency because of the non-linearity of the magnetic field.

Referring to FIG. 3, FIG. 4B and FIG. 5B, the parts producing the artifact are in frequency bands, which are different from that of the desired slice plane, in the state where no gradient magnetic field is applied and only the static magnetic field exists. Now, before beginning the prior art imaging sequence, at first the parts producing the artifact are excited by applying a radio frequency magnetic field thereto in a frequency band, which includes the parts emitting the artifact and doesn't include the desired slice plane. Next, the phase of the excited spin is extremely rotated by applying at least one of the gradient magnetic fields $G_x$, $G_y$ and $G_z$ strongly. When the quantity of the phase rotation is set e.g. so as to be equal to the quantity which can rotate it by $2\pi$ within 1 pixel in the image, as indicated in FIGS. 9A and 9B, signals are cancelled mutually within 1 pixel and thus the signal vectorially synthesized gets extremely small. When the usual imaging sequence is carried out thereafter, it is possible to reduce the produced artifact in such an extent that it cannot be practically recognized.

In the practical imaging the parts where the artifact is produced are subjected to two excitations, one being for cancelling, the other being for imaging. If the sum of the two were exactly 180° in the whole region, where the artifact is produced, no artifact would be produced, even if no phase rotation is effected. However, since a real exciting pulse is imperfect, the phase rotation for cancelling should be used. The phase rotation in the parts, where the artifact is produced, is given also in the sequence for imaging and the spin is further rotated or on the contrary returned. Consequently, in order to effect better the cancel described above, a stronger phase rotation is given. The stronger the given phase rotation is, the more purely only the high spatial frequency component from the parts, where the artifact is produced, is imaged as the artifact. For usual object bodies to be examined, since the component is extremely small, it can be reduced in such an extent that it cannot be practically recognized.

DESCRIPTION OF THE PREFERRED EMBODIMENTS

Hereinbelow embodiments of this invention will be explained in detail, referring to the attached drawings.

Figure 1:
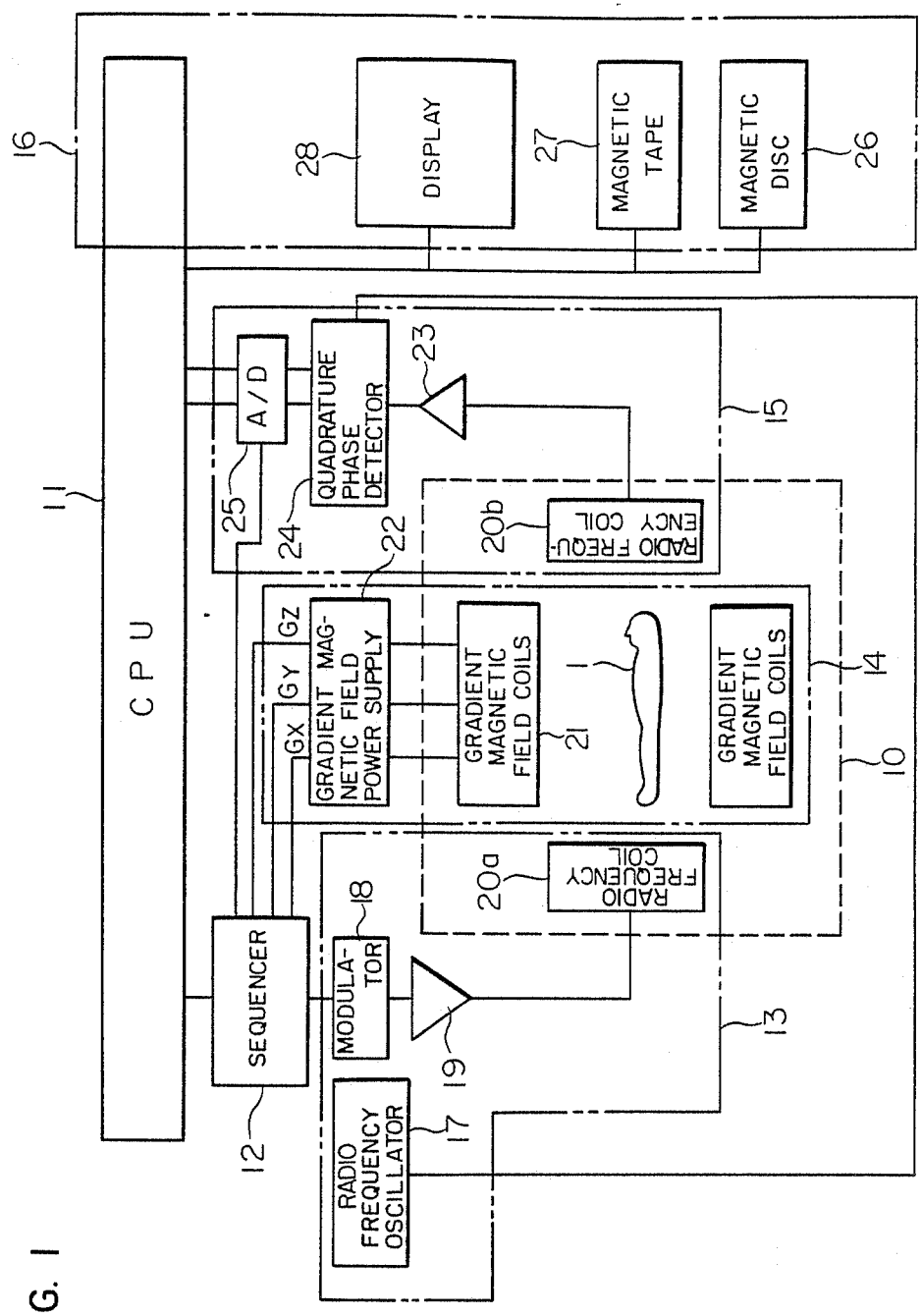
FIG. 1 is a scheme illustrating the construction of an NMR imaging apparatus, which is an embodiment of this invention.
Figure 2:
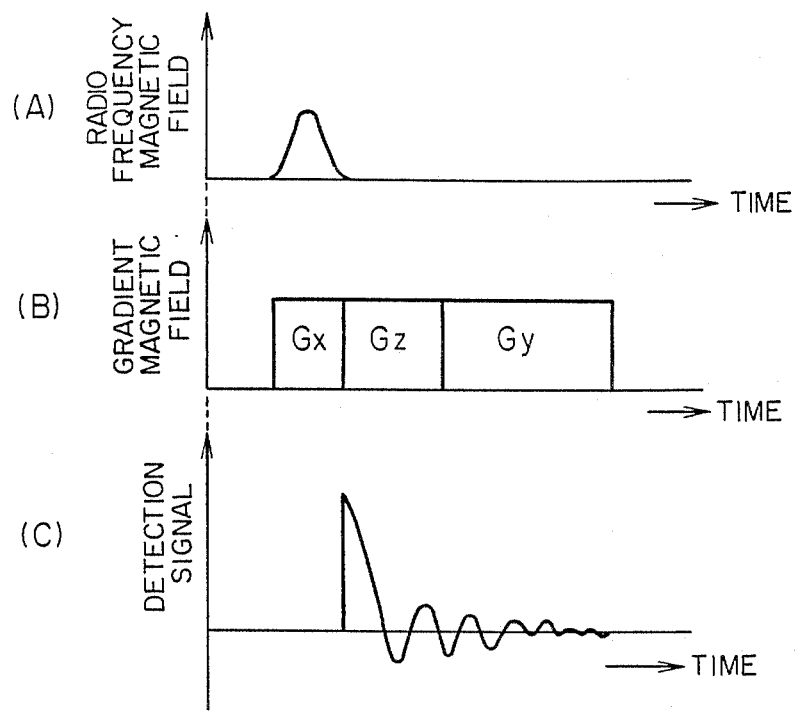
FIG. 2 shows the principle of the prior art Fourier zeugmatography method.
Figure 3:
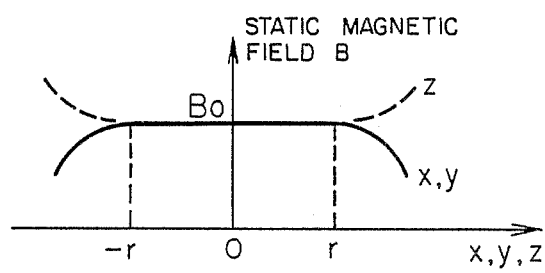
FIG. 3 is a scheme showing a state, where a static magnetic field is applied.
Figure 4A:
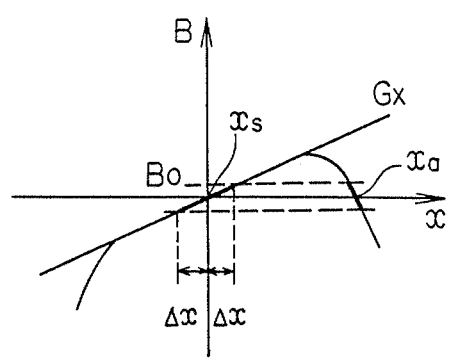
FIG. 4A is a scheme showing a state, where a gradient magnetic field $G_x$ is applied.
Figure 4B:
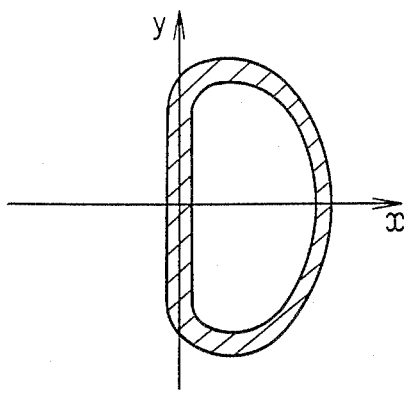
FIG. 4B is a scheme showing a part excited selectively.
Figure 5A:
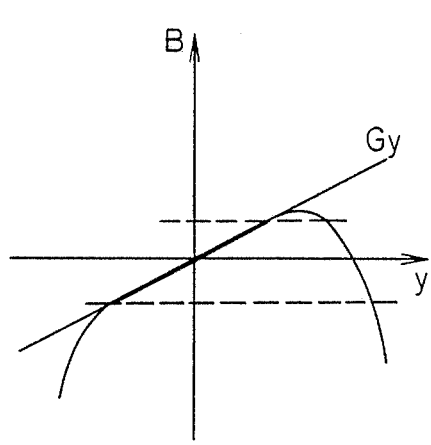
FIG. 5A is a scheme showing a state, where a gradient magnetic field $G_y$ is applied.
Figure 5B:
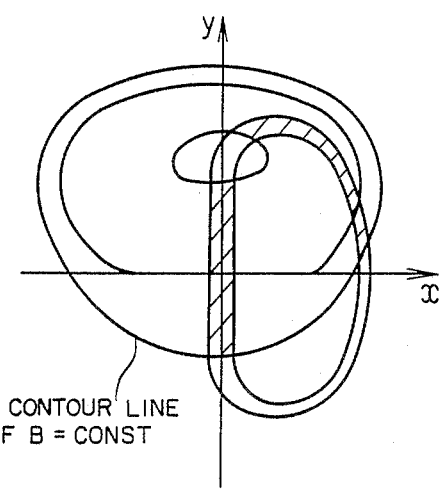
FIG. 5B is a scheme showing a part excited selectively.

FIG. 1 is a block diagram illustrating the whole construction of a nuclear magnetic resonance imaging apparatus according to this invention. This nuclear magnetic resonance apparatus is an apparatus for obtaining a tomographic image of an object body to be examined, utilizing the nuclear magnetic resonance (NMR) phenomenon, which consists of a static magnetic field generating magnet 10, a central processing unit (CPU) 11, a sequencer 12, a transmitting system 13, a gradient magnetic field generating system 14, a receiving system 15 and a signal processing system 16. The static magnetic field generating magnet 10 stated above generates a strong and uniform static magnetic field around an object body to be examined 1 in a direction parallel or perpendicular to the axis of the body, for which magnetic field generating means by using the permanent magnet type, the resistive magnet type or the superconductive magnet type is disposed for generating a static magnetic field in a space having a certain extent around the object body to be examined 1. The sequencer 12 stated above works under the control of the CPU 11 and sends various instructions necessary for acquiring data for obtaining a tomographic image of the object body to be examined 1 to the transmitting system 13, the gradient magnetic field generating system 14 and the receiving system 15. The transmitting system 13 consists of a radio frequency oscillator 17, a modulator 18, a radio frequency amplifier 19 and a radio frequency coil 20a on the transmitting side, amplitude-modulates a high frequency pulse generated by the high frequency oscillator 17 by means of the modulator 18 according to instructions from the sequencer 12, depending on e.g. the waveform of a sine function, and supplies a frequency pulse thus amplitude-modulated to the radio frequency coil disposed closely to the object body to be examined 1, after having amplified it, so that the object body to be examined 1 is irradiated with electro-magnetic wave. The gradient magnetic field generating system 14 consists of gradient magnetic field coils 21 wound in the directions of three axes X, Y and Z, and gradient magnetic field power supply 22 driving the coils, respectively, and applies gradient magnetic fields $G_x$, $G_y$ and $G_z$ in the direction of the three axes X, Y and Z to the object body to be examined 1 by driving the gradient magnetic field power supply 22 for the respective coils according to instruction signals from the sequencer 12 described above. It is possible to set a slice plane in an arbitrary direction with respect to the object body to be examined 1, depending on how to apply these gradient magnetic fields. The receiving system 15 consists of a radio frequency coil 20b on the receiving side, an amplifier 23, a quadrature phase detector 24 and an A/D converter 25 and is so constructed that response electromagnetic wave (NMR signal) coming from the object body to be examined 1 irradiated with electro-magnetic wave emitted by the radio frequency coil 20a on the transmitting side is detected by the radio frequency coil 20b disposed closely to the object body to be examined 1, inputted through the amplifier 23 and the quadrature phase detector 24 into the A/D converter 25, by which it is converted into a digital value, and further compiled into 2 series of acquired data sampled by the quadrature phase detector 24 with a timing determined by an instruction from the sequencer 12, whose signal is sent to a signal processing system 16. This signal processing system 16 consists of the CPU 11, a recording device such as magnetic discs 26, magnetic tapes 27, etc. and a display 28 such as a CRT etc. and is so constructed that the CPU 11 effects operation processing for image reconstruction such as Fourier transformation, etc. and displays the distribution imaged by suitably operating the distribution of the signal intensity or a plurality of signals coming from an arbitrary tomographic plane on the display 28. Further, in FIG. 1, the radio frequency coils 20a and 20b on the transmitting and receiving sides and the gradient magnetic field coils 21 are located in a magnetic field space of the static magnetic field generating magnet 10 disposed in a space around the object body to be examined 1.

According to this invention, in order to achieve the object described above, just before beginning a usual imaging sequence by means of the sequencer 12, selective excitation of the parts, where the artifact is produced, and phase rotation are effected.

Figure 6:
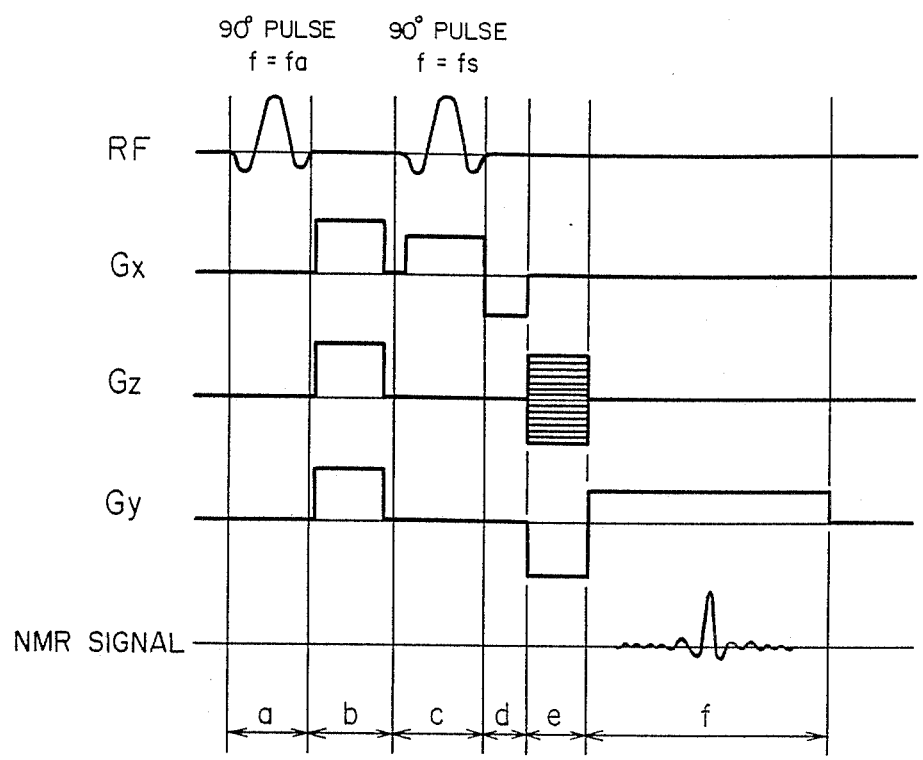
FIG. 6 illustrates a sequence of the NMR imaging method, which is an embodiment of this invention.
Figure 7A:
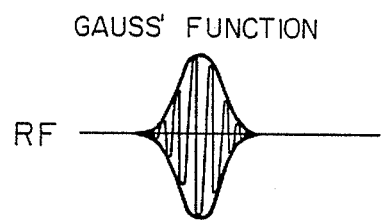
FIG. 7A is a scheme showing a high frequency pulse amplitude-modulated with a Gauss' function.
Figure 7B:
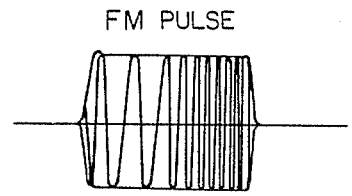
FIG. 7B is a scheme showing a high frequency wave, which is an FM wave.
Figure 9A:
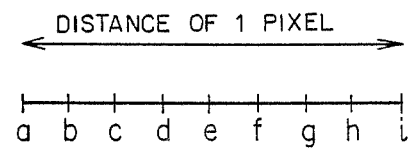
FIGS. 9A and 9B are schemes showing a state of the phase rotation of spin.
Figure 9B:
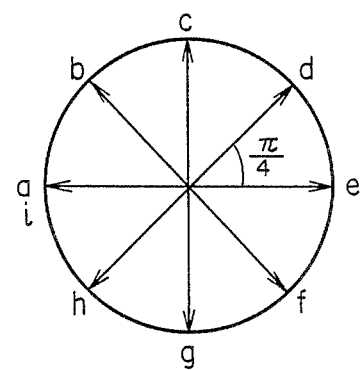

FIG. 6 shows a sequence, in the case where the method according to this invention is applied to the SR (Saturation Recovery) sequence of the spin warp method. In the figure a and b are the portions added according to this invention. In a, in a state where no gradient magnetic fields are applied, the spin is brought down by 90° in the parts outside of the uniform magnetic field, where the artifact is produced, by applying a 90° pulse with the frequency component corresponding to the parts. The 90° pulse is applied by applying a radio frequency magnetic field to the parts producing the artifact in a frequency band which includes the parts emitting the artifact and which doesn't include the desired slice plane with the amplitude being adjusted so as to bring down the spin in the parts producing the artifact by almost 90°. Next, in b, $G_x$, $G_y$ and $G_z$ are applied so that the phase of the excited spin is extremely rotated. As shown in b in FIG. 6, when the gradient magnetic fields $G_x$, $G_y$, and $G_z$ are applied in the direction of three axes, i.e., a gradient of the gradient magnetic fields $G_x$, $G_y$, and $G_z$ is in the direction of x, y, and z, respectively, phase rotation occurs in every direction of the three axes in response to the position of the spin brought down. Thus, cancellation of signals is performed as shown in FIGS. 9A and 9B. By this operation it is possible to reduce extremely the amount of signals originating from the parts, where the artifact is produced After that, by each the sequence of c, d, e and f, signal measurements are effected during the selection of the slice plane (c), the phase matching of the slice plane (d), the phase encode concerning $G_z$ (e) and the frequency encode concerning $G_y$ (e and f). In the imaging the quantity of $G_z$ is varied stepwise and measurements are effected while repeating the sequence indicated in FIG. 6 just as for the prior art sequence. Although, in a in FIG. 6, a part of a sine function for the 90° selective excitation pulse is used, the Gauss' function, the FM pulse, as indicated in FIGS. 7A and 7B, their variations, or combined pulses may be used instead thereof. In particular, according to this invention, since in many cases the band of the parts, where the artifact is produced, is more than 10 times as wide as the band used for the selective excitation of the slice plane, it is efficient to use an FM pulse having a great excitation efficiency. Furthermore, although in b in FIG. 6 the gradient magnetic fields $G_x$, $G_y$ and $G_z$ are applied in the directions of the three axes, the same effect can be obtained, if at least one of them is applied thereto. Further, in the case where the precision of the 90° pulse is high, even if no gradient magnetic fields are applied in b, since the parts, where the artifact is produced, is rotated by 180° by the 90° pulse for imaging (part c), practically no signal is produced and the artifact can be reduced.

Although in FIG. 6 an embodiment according to the two-dimensional spin warp method is indicated, if the object and the method of this invention are understood, it can be easily inferred that the method according to this invention can be applied to any general NMR imaging, e.g. a case where no 90° pulse is used for the selective excitation and the flip angle is changed, a case where a spin echo is used, a case where the multislice or the multiecho is effected, a case of not the two-dimensional but the three-dimensional imaging, a case of not the 2DFT (two-dimensional Fourier transformation) method, by which the phase encoding is effected, but the projection reconstruction method such as X-ray CT, etc.

Figure 8:
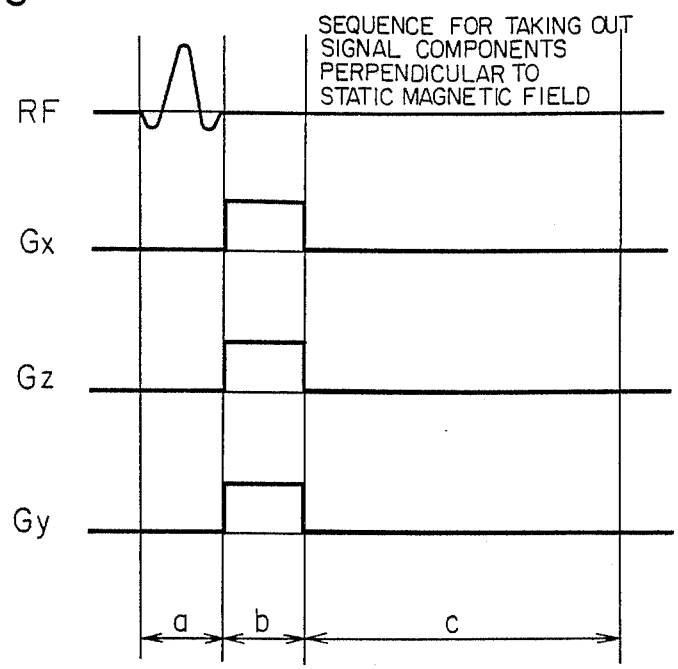
FIG. 8 illustrates a sequence of the NMR imaging method, which is another embodiment of this invention.

FIG. 8 is a scheme indicating a case where the method according to this invention is used for various imaging methods. The object described previously can be achieved by using the sequence for generating the signal component perpendicular to the static magnetic field in the prior art sequence for imaging for the part c indicated in the figure and by carrying out a sequence identical to a and b in FIG. 6 directly before it. For the method indicated in FIG. 8 it may be inferred that this invention can be applied to all of the SR method, the SE (Spin Echo) method, and the IR (Inversion Recovery) method, which are used for the NMR imaging.

As explained above, according to this invention, it becomes possible to make a remarkable reduction on the artifact originating from the object body to be examined outside of the uniform magnetic field and to solve the problems described above even with a highly economical static magnetic field generating device having a smaller uniform magnetic field than the object body to be examined.

We claim:

1. In an NMR imaging method, whereby a static magnetic field, first gradient magnetic fields $G_x$, $G_y$, $G_z$ and a first radio frequency magnetic field are applied to an object body to be examined in order to generate a nuclear magnetic resonance (NMR) signal so that an image representing physical properties of said object body to be examined is obtained by detecting said NMR signal, the improvement wherein before said NMR signal having a component in the direction perpendicular to the direction of said static magnetic field is obtained from a part to be imaged of said object body to be examined by application of said first radio frequency magnetic field and said first gradient magnetic fields, a second radio frequency magnetic field is applied to parts within said optical body other than said part to be imaged in order to excite selectively said parts other than the part to be imaged.

2. An NMR imaging method according to claim 1, wherein at least one of second gradient magnetic fields $G_x$, $G_y$, $G_z$ is applied in order to rotate the phase of the NMR signal generated from said parts within said object body other than the part to be imaged after having applied said second radio frequency magnetic field to said parts other than the part to be imaged.

3. An NMR imaging apparatus comprising:

static magnetic field generating means for generating a static magnetic field to an object body to be examined;

gradient magnetic field generating means for generating at least a first gradient magnetic field to said object body to be examined;

radio frequency magnetic field generating means for applying at least a first radio frequency magnetic field to said object body to be examined;

signal detecting means for detecting an NMR signal originating from said object body to be examined in accordance with the application of said static magnetic field, said at least first gradient magnetic field and said at least first radio frequency magnetic field;

image reconstruction means for obtaining an image representing physical properties of said object body to be examined by using said NMR signal thus detected; and control means for controlling said radio frequency magnetic field generating means to generate a second radio frequency magnetic field for application to parts within said object body to be examined other than a part to be imaged in order to excite selectively said parts other than the part to be imaged prior to application of said first radio frequency magnetic field and said first gradient magnetic field.

4. An NMR imaging apparatus according to claim 3, wherein said control means controls said radio frequency magnetic field generating means to generate an FM pulse for said second radio frequency magnetic field.

5. An NMR imaging apparatus according to claim 3, wherein said control means controls said gradient magnetic field generating means to generate at least one second gradient magnetic field in order to rotate the phase of the NMR signal generated from said parts other than the part to be imaged after application of said second radio frequency magnetic field.

* * * * *